US009978595B2

(12) United States Patent
Lee et al.

(10) Patent No.: US 9,978,595 B2
(45) Date of Patent: May 22, 2018

(54) PHOTO MASK AND EXPOSURE SYSTEM

(71) Applicants: BOE TECHNOLOGY GROUP CO., LTD., Beijing (CN); Chengdu BOE Optoelectronics Technology Co., Ltd., Chengdu, Sichuan (CN)

(72) Inventors: Seungmin Lee, Beijing (CN); Zhenrui Fan, Beijing (CN); Wenxuan Zhang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 57 days.

(21) Appl. No.: 15/104,769

(22) PCT Filed: Feb. 16, 2016

(86) PCT No.: PCT/CN2016/073843
§ 371 (c)(1),
(2) Date: Jun. 15, 2016

(87) PCT Pub. No.: WO2017/041438
PCT Pub. Date: Mar. 16, 2017

(65) Prior Publication Data
US 2017/0194139 A1 Jul. 6, 2017

(30) Foreign Application Priority Data
Sep. 11, 2015 (CN) .......................... 2015 1 0580628

(51) Int. Cl.
*G03F 1/36* (2012.01)
*G03F 1/50* (2012.01)
(Continued)

(52) U.S. Cl.
CPC ...... *H01L 21/0274* (2013.01); *G02B 27/0988* (2013.01); *G03F 1/144* (2013.01);
(Continued)

(58) Field of Classification Search
CPC .............. G03G 1/36; G02F 7/20; G03B 27/72
See application file for complete search history.

(56) References Cited

U.S. PATENT DOCUMENTS

| 5,395,739 A | 3/1995 | Nakatani et al. |
| 2009/0109364 A1* | 4/2009 | Yang ..................... G03F 7/0005 349/46 |

FOREIGN PATENT DOCUMENTS

| CN | 101105633 A | 1/2008 |
| CN | 101359169 A | 2/2009 |

(Continued)

OTHER PUBLICATIONS

Form PCT/ISA/210 issued in corresponding international application No. PCT/CN2016/073843 dated Apr. 27, 2016.
(Continued)

*Primary Examiner* — Stephen Rosasco
(74) *Attorney, Agent, or Firm* — Nath, Goldberg & Meyer; Joshua B. Goldberg

(57) ABSTRACT

The present invention belongs to the field of semiconductor technology, and specifically provides a photo mask and an exposure system. The photo mask is provided with a patterning structure for forming a resulting pattern, the patterning structure comprising a strip-like main body for forming a rectilinear pattern, wherein the patterning structure further comprises a patterning structure auxiliary unit provided at two sides of the strip-like main body, the patterning structure auxiliary unit being capable of adjusting and compensating direction and intensity of light during exposure. With the photo mask, the resulting pattern formed through exposure
(Continued)

using the photo mask has improved fineness, thereby improving accuracy of the formed rectilinear pattern.

19 Claims, 3 Drawing Sheets

(51) Int. Cl.
*H01L 21/027* (2006.01)
*G03F 7/20* (2006.01)
*G02B 27/09* (2006.01)
*G03F 1/00* (2012.01)

(52) U.S. Cl.
CPC .................. *G03F 1/16* (2013.01); *G03F 1/36* (2013.01); *G03F 1/50* (2013.01); *G03F 7/2016* (2013.01)

(56) References Cited

FOREIGN PATENT DOCUMENTS

| CN | 101424882 A | 5/2009 |
| CN | 102129166 A | 7/2011 |
| CN | 103620497 A | 3/2014 |
| CN | 105093813 A | 11/2015 |

OTHER PUBLICATIONS

Form PCT/ISA/220 issued in corresponding international application No. PCT/CN2016/073843 dated Apr. 27, 2016.
Form PCT/ISA/237 issued in corresponding international application No. PCT/CN2016/073843 dated Apr. 27, 2016.

* cited by examiner

PHOTO MASK AND EXPOSURE SYSTEM

This is a National Phase Application filed under 35 U.S.C. 371 as a national stage of PCT/CN2016/073843, filed Feb. 16, 2016, an application claiming the benefit from the Chinese patent Application No. 201510580628.8, filed Sep. 11, 2015, the content of each of which is hereby incorporated by reference in its entirety.

FIELD OF THE INVENTION

The present invention belongs to the field of semiconductor technology, and particularly relates to a photo mask and an exposure system.

BACKGROUND OF THE INVENTION

Exposure process is one of important fabrication processes in manufacturing a semiconductor device, and in the exposure process, a pattern on a mask plate is accurately transferred onto a photoresist by photochemical reaction. For example, in a manufacturing process of an array substrate (comprising thin film transistors (TFTs)) of a display device, a corresponding material film layer (e.g., an indium tin oxide layer, or the like) is firstly coated or sputtered on a base substrate, a photoresist is then coated on the material film layer, a fine pattern on a mask plate is transferred to the photoresist by performing processes such as exposure, development and the like on the photoresist, and subsequently, the material film layer is etched under the protection of the photoresist, so as to finally form a pattern of a corresponding layer in the array substrate.

Photo mask is an important medium used in the exposure process, FIG. 1 illustrates a patterning structure in an existing photo mask for forming a rectilinear pattern, and the patterning structure is strip-like. In the exposure process, the patterning structure on the photo mask is analyzed and copied onto a patterning layer by an exposure machine. The resolution R of the exposure machine can be calculated according to the Rayleigh's equations:

$$R = K1 * \lambda / NA$$

$$DOF = K2 * \lambda / (NA)^2$$

where R is the resolution; K1 is a process factor and may be a fixed value in the range of 0.6 to 0.8; $\lambda$ is the wavelength of exposure light; NA (numerical aperture) indicates ability of collecting diffracted light, and is one of characteristic optical parameters of the exposure machine;

DOF refers to depth of focus. The focus is a point at which the image is presented best, the depth of focus is a range near the focus, and the image continuously remains clear in the range of the depth of focus; K2 is a process factor.

It can be seen that the solution R decreases as the value of NA increases (the smaller the resolution R, the higher the resolving power of the exposure machine), and the depth of focus decreases rapidly as the value of NA increases. It can be known from the Rayleigh's equations that, a higher resolving power is achieved at the expense of the depth of focus, however, the smaller the depth of focus, the smaller the margin of the process, and the higher the process requirement, and thus, a better control means of the depth of focus is required for a device.

In an existing exposure process, due to the limitation of the resolving power of the exposure machine, degree of distortion of an image formed after being exposed by the exposure machine increases when a line width of a micro-pattern reaches or exceeds the resolving power of the exposure machine (i.e., the line width of the micro-pattern is equal to or even smaller than the resolution R), which deteriorates uniformity and profile of the line width, further results in a defective exposure process, and degrades quality of a semiconductor device.

SUMMARY OF THE INVENTION

In view of the above problems existing in the prior art, a technical problem to be solved by the present invention is to provide a photo mask and an exposure system. A resulting pattern formed through exposure using the photo mask and the exposure system has high fineness, and a formed rectilinear pattern has high accuracy.

According to one aspect of the present invention, there is provided a photo mask, including a patterning structure for forming a resulting pattern, the patterning structure including a strip-like main body for forming a rectilinear pattern, wherein the patterning structure further includes a patterning structure auxiliary unit provided at two sides of the strip-like main body, the patterning structure auxiliary unit being capable of adjusting and compensating direction and intensity of light during exposure.

Optionally, the patterning structure auxiliary unit includes a serrated wing part connected to the strip-like main body.

Optionally, the serrated wing part includes a first wing and a second wing respectively distributed on the two sides of the strip-like main body and symmetric with respect to the strip-like main body.

Optionally, the first wing is distributed throughout one side of the strip-like main body, and the second wing is distributed throughout the other side of the strip-like main body.

Optionally, each of the first wing and the second wing includes a plurality of protrusions having a same shape and a same size, a base of each protrusion coincides with a side edge of the strip-like main body, and the highest point of the protrusion is opposite to the side edge of the strip-like main body.

Optionally, the protrusion is in the shape of a triangle, a semicircle, an oval or a fan, and an apex angle of the triangle is in the range of 30 degrees to 120 degrees.

Optionally, a ratio of a width of the strip-like main body to a width of the first wing or the second wing is in the range of 1:1 to 3:1.

Optionally, the patterning structure auxiliary unit includes a columnar part spaced apart from the strip-like main body.

Optionally, the columnar part includes a first column and a second column symmetric with respect to the strip-like main body, bottoms and tops of the first and second columns are substantially level with those of the strip-like main body, respectively.

Optionally, a ratio of a width of the strip-like main body to a width of the first column and/or the second column is in the range of 1:1 to 9:1.

Optionally, a ratio of a width of the serrated wing part, a width of a gap between the serrated wing part and the first column, and a width of the first column is in the range of 1:1:1 to 3:1:1

Optionally, the columnar part is provided at an outer side of and spaced apart from the serrated wing part, and a width of a gap between the serrated wing part and the columnar part at a same side of the strip-like main body is equal to that of the columnar part at said side.

Optionally, the patterning structure is a light-transmissive pattern or a semi-transparent pattern, or, the patterning structure is an opaque pattern.

Optionally, the patterning structure includes a plurality of strip-like main bodies, and adjacent strip-like main bodies share the columnar part located therebetween.

Optionally, the photo mask further includes a transparent base substrate and a protection layer, and the patterning structure is formed between the transparent base substrate and the protection layer.

An exposure system, including any one of the above photo masks.

The beneficial effects of the present invention are as follows: by providing the photo mask with a patterning structure auxiliary unit at two sides of a strip-like main body for forming a rectilinear pattern, the resolution of an exposure machine on a micro-pattern (especially micro-pattern reaching or exceeding the ultimate resolving power of the exposure machine) is improved, and with the design of the photo mask, the imaging performance is improved without modifying an existing device, and the high PPI property of the exposure machine is fully used, so that the formed pattern has increased fineness, which facilitates improving aperture ratio and light-transmittance of a pixel, thereby making it possible to manufacture a display product having high PPI.

DETAILED DESCRIPTION OF THE EMBODIMENTS

In order that those skilled in the art can better understand the technical solutions of the present invention, a photo mask and an exposure system of the present invention will be further described in detail below in conjunction with the accompanying drawings and specific implementations.

Resolving power of an exposure machine, also referred to as resolution, is the ability of reproducing fine parts of a photographed original, and indicates the smallest line width (or interval) that can be resolved by the exposure machine during exposure. The resolving power of the exposure machine is generally fixed when the device is assembled, and thus remains unchanged during exposure using the exposure machine. Fineness of the resulting pattern formed through exposure process is related to device parameters of the exposure machine and technological parameters of the exposure process. However, since the device parameters of the exposure machine are fixed and cannot be changed during the process, the inventor of the present invention found an unconventional approach, in which the technological parameters of the exposure process are changed to improve the fineness of the resulting pattern. Specifically, the technical concept of the present invention lies in that both fitness of the pattern and depth of focus are guaranteed by improving the patterning structure in a photo mask, that is, imaging performance of a device is further improved without changing the depth of focus (i.e., without modifying the device), so as to obtain better resolving power, thereby ensuring both.

First Embodiment

This embodiment provides a photo mask, and a resulting pattern formed through an exposure using the photo mask can have improved fineness, thereby improving accuracy of a formed rectilinear pattern.

Figure 1:
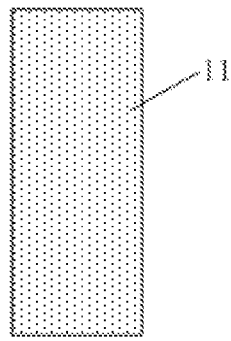
FIG. 1 is a schematic diagram of a patterning structure in an existing photo mask for forming a rectilinear pattern.
Figure 2:
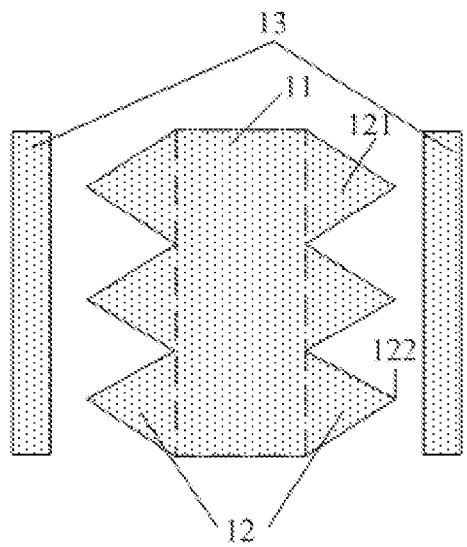
FIG. 2 is a schematic diagram of a patterning structure of a photo mask provided by a first embodiment of the present invention.

As shown in FIG. 2, the photo mask is provided with a patterning structure for forming a resulting pattern, the patterning structure includes a strip-like main body 11 for forming a rectilinear pattern and a patterning structure auxiliary unit provided at two sides of the strip-like main body 11, the patterning structure auxiliary unit is able to adjust and compensate direction and intensity of light during exposure, wherein the strip-like main body 11 is used for forming an actual rectilinear pattern, and its length and width are related to the used exposure machine but generally well-matched with those of the actual rectilinear pattern.

Specifically, the patterning structure auxiliary unit includes a serrated wing part 12 connected to the strip-like main body 11 and a columnar part 13 spaced apart from the strip-like main body 11. In the example shown in FIG. 2, the patterning structure auxiliary unit includes the serrated wing part 12 and the columnar part 13 each provided at the two sides of the strip-like main body 11, and both the serrated wing part 12 and the columnar part 13 are symmetric with respect to the strip-like main body 11.

In this embodiment, the serrated wing part 12 includes a first wing and a second wing respectively distributed throughout the two sides of the strip-like main body 11 and symmetric with respect to the strip-like main body 11. Each of the first wing and the second wing includes a plurality of protrusions 121 having a same shape and a same size, each protrusion 121 has a base coinciding with a side edge of the strip-like main body 11 and the highest point 122 opposite to the side edge of the strip-like main body 11. Here, the plurality of protrusions 121 distributed on each side of the strip-like main body 11 may be connected with each other. For example, in the example shown in FIG. 2, a plurality of protrusions 121 connected to each other are distributed evenly on each side edge of the strip-like main body 11, each protrusion 121 is an equilateral triangle, one side (i.e., the base) of each protrusion 121 coincides with the side edge of the strip-like main body 11, and sides of adjacent protrusions 121 coinciding with the side edge of the strip-like main body 11 are connected (i.e., the bases are connected), so that the plurality of protrusions 121 distributed on each side of the strip-like main body 11 are connected with each other. Needless to say, the structure of the serrated wing part 12 shown in FIG. 2 is only exemplary but not restrictive, and the protrusions 12 distributed on each side of the strip-like main body 11 may be flexibly arranged according to actual situation, which is not limited herein. For example, the plurality of protrusions 12 distributed on each side of the strip-like main body 11 may be arranged at intervals (not shown).

Ratio of the width of the strip-like main body 11 to the width of the first wing (or second wing), i.e., ratio of the width of the strip-like main body 11 to the distance between the highest point 122 and the base of the protrusion 121, may be in the range of 1:1 to 3:1. In one example, the ratio of the width of the strip-like main body 11 to the distance between the highest point 122 and the base of the protrusion 121 is 2:1.

The protrusion 121 may be in the shape of a triangle, such as an equilateral triangle or a right triangle, a semicircle, an oval or a fan. If the protrusion 121 is in the shape of a triangle, such as an equilateral triangle or a right triangle, the apex angle of the triangle is in the range of 30 degrees to 120 degrees. For example, the apex angle of the triangle may be 80 degrees. It should be understood that, in the photo mask of the present embodiment, the shape of the protrusion 121 may be set based on the accuracy of the rectilinear pattern to be formed, and may be, but not limited to, the above shapes, and the triangle-shaped protrusion 121 shown in FIG. 2 is only exemplary but not restrictive.

In addition, the columnar part 13 is provided at an outer side of the serrated wing part 12 and spaced apart from the serrated wing part 12, the columnar part 13 includes a first column and a second column symmetric with respect to the strip-like main body 11, bottoms and tops of the first and second columns are substantially level with those of the strip-like main body 11, respectively.

Figure 4:
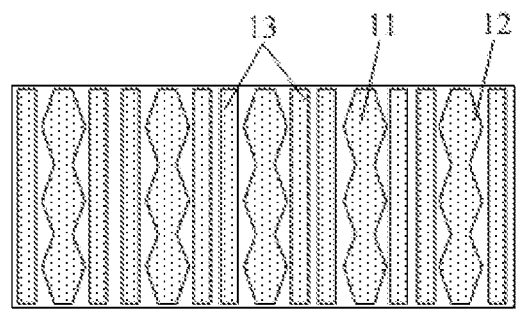
FIG. 4 is a partial view of a photo mask including a plurality of the patterning structures in FIG. 2.

FIG. 4 is a partial view of a photo mask including a plurality of the patterning structures in FIG. 2. As shown in FIG. 4, each strip-like main body 11 is used for forming one independent rectilinear pattern, and with the strip-like main body 11 supplemented with the serrated wing part 12 and the columnar part 13 provided at the two sides thereof, a plurality of rectilinear patterns with higher accuracy can be obtained. The plurality of rectilinear patterns in FIG. 4 may be a plurality of gate lines arranged in parallel or a plurality of data lines arranged in parallel.

In the case of dense resulting pattern, in order to reduce pattern density of the patterning structure auxiliary units in the patterning structures in the photo mask and ensure accuracy in an exposure process, optionally, adjacent strip-like main bodies 11 may share the columnar part 13 provided therebetween. That is, two adjacent strip-like main bodies 11 may share the first column or the second column provided therebetweeen to reduce density of the patterning structures on the premise of ensuring good resulting pattern.

Figure 3:
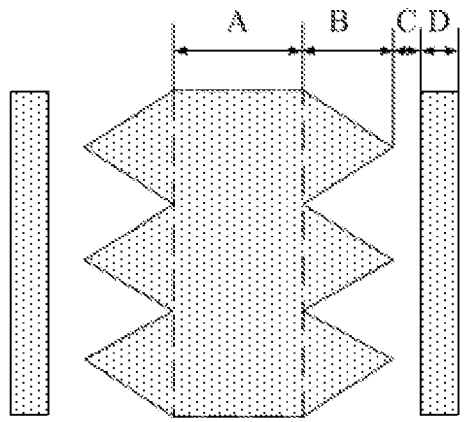
FIG. 3 illustrates size labels of respective parts of the patterning structure in FIG. 2.

Optionally, ratio between the widths of the serrated wing part and the columnar part at the same side of the strip-like main body 11, that is, the ratio of the width of the first (or second) wing to the width of the first (or second) column, is 1:1 to 3:1, and the width of the gap between the serrated wing part and the columnar part at the same side of the strip-like main body 11 is equal to that of the columnar part, that is, the width of the gap between the first (or second) wing and the first (or second) column is equal to that of the first (or second) column. In the example shown in FIG. 3, ratio of the width B of the first wing, the width C of the gap between the first wing and the first column and the width D of the first column is 2:1:1. In this case, it can be easily understood that, as the first and second columns are symmetric to each other, it can be known that the ratio of the width of the second wing, the width of the gap between the second wing and the second column and the width of the second column is also 2:1:1.

The width C of the gap may be adjusted according to requirements for resolving power of pattern and depth of focus. In general, the larger the width C of the gap, the better the resolving power of the resulting pattern, and the better the depth of focus. Optionally, the width A of the strip-like main body 11: the width B of the first (or second) wing: the width C of the gap between the first (or second) wing and the first (or second) column: the width D of the first (or second) column may be 4:2:1:1, and Table 1 shows some optional values of the widths and degrees of the angle of the wing away from the strip-like main body 11.

TABLE 1

| A/μm | B/μm | C/μm | D/μm | Degree of angle/° |
|------|------|-------|-------|-------------------|
| 3    | 1.5  | 0.75  | 0.75  | 80 |
| 2.5  | 1.25 | 0.625 | 0.625 | 80 |
| 2.0  | 1    | 0.5   | 0.5   | 80 |
| 1.5  | 0.75 | 0.375 | 0.375 | 80 |

During exposure process, photoresist is generally applied as a coating layer, and then a specific resulting pattern is formed under the photoresist coating layer through an exposure process, a development process and an etching process. Photoresist includes positive photoresist and negative photoresist. In this embodiment, light transmitting properties of the patterning structure in the photo mask may be set based on chemical reaction mechanism and developing principle of the photoresist used in the exposure process. For example, in one example, all of the strip-like main body 11, the serrated wing part 12 and the columnar part 13 are light-transmissive structures or semi-transparent structures, or, all of the strip-like main body 11, the serrated wing part 12 and the columnar part 13 are opaque structures. For negative photoresist, since it forms insoluble substance after being irradiated with light and cannot be removed by development, all of the strip-like main body 11, the serrated wing part 12 and the columnar part 13 are configured to be light-transmissive structures, so as to reserve the negative photoresist in areas corresponding to the strip-like main body 11, the serrated wing part 12 and the columnar part 13, and further reserve the actual resulting pattern under the negative photoresist. For positive photoresist, since it forms soluble substance after being irradiated with light and can be removed by development, all of the strip-like main body 11, the serrated wing part 12 and the columnar part 13 are configured to be opaque structures, so as to reserve the positive photoresist in areas corresponding to the strip-like main body 11, the serrated wing part 12 and the columnar part 13, and further reserve the actual resulting pattern under the positive photoresist.

The photo mask provided by the embodiment can be used for forming strip-like gate line pattern and/or strip-like data line pattern. In one example, the patterning structure in the photo mask includes a strip-like main body 11 for forming a gate line or a strip-like main body 11 for forming a data line, and a patterning structure auxiliary unit provided at two sides of the strip-like main body 11 and symmetric with respect to the strip-like main body 11. According to the process of forming gate lines and data lines in practical applications, a same photo mask provided by the present invention may be used to form the gate lines and the data lines, or two different photo masks provided by the present invention may be used to form the gate lines and the date lines separately, which is not limited herein. In another example, the patterning structure in the photo mask includes: a strip-like gate line main body 11 for forming a gate line and a strip-like data line main body 11 for forming a data line; a patterning structure auxiliary unit distributed on two sides of the strip-like gate line main body 11 and symmetric with respect to the strip-like gate line main body 11, and/or a patterning structure auxiliary unit distributed on two sides of the strip-like data line main body 11 and symmetric with respect to the strip-like data line main body 11.

It could be understood that, within a sufficiently small length, a curve can be regarded as a straight line in some way. Therefore, the photo mask provided by the embodiment using a patterning structure auxiliary unit to improve resolution of a micro-pattern is applicable to any linear pattern, and the foregoing specific description on the principle of compensating accuracy of the rectilinear pattern is only exemplary but not restrictive.

Figure 5:
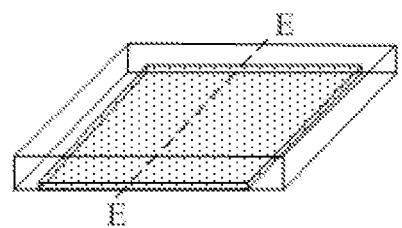
FIG. 5 is a schematic structure diagram of a photo mask provided by an embodiment of the present invention.
Figure 6:
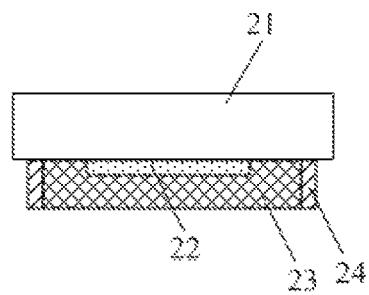
FIG. 6 is a cross-sectional view of the photo mask taken along line EE in FIG. 5.

The photo mask generally includes a transparent base substrate 21, a protection layer 23 and a pattern layer 22 provided between the transparent base substrate 21 and the protection layer 23, and the patterning structure(s) (each including the strip-like main body and the patterning structure auxiliary unit) forms the pattern layer 22. As shown in FIGS. 5 and 6, the photo mask includes a transparent base substrate 21, a pattern layer 22 and a protection layer 23 which are sequentially provided, and the protection layer 23 and the transparent base substrate 21 are formed to be a whole through a film bonding frame 24, wherein the pattern layer 22 may be formed to have patterns of data lines or data lines, and according to properties of the photoresist that is used together with the photo mask, the pattern layer 22 may be an opaque structure made of an opaque material (chromium, in general), and other part than the pattern layer 22 is interspace or a light-transmissive structure made of a light-transmissive material. Needless to say, the pattern layer 22 may be interspace or a light-transmissive structure made of a light-transmissive material, and other part than the pattern layer 22 may be an opaque structure made of an opaque material.

In the photo mask in the present embodiment, by providing auxiliary serrated wing part and columnar part at two sides of a strip-like main body for forming a rectilinear pattern, and considering that an exposure machine, due to its limited resolving power, cannot accurately form a pattern whose line width is smaller than its resolution, the resolution of the pattern formed through the strip-like main body is ensured by providing the patterning structure auxiliary unit at two sides of the strip-like main body; by further using light diffraction, width of exposure of the exposure machine on a micro-pattern can be improved by 5% to 10%; meanwhile, in a display substrate, the smaller the line width, the smaller the area occupied by a corresponding pixel circuit (e.g., an opaque thin film transistor) in a pixel region, and the larger the effective display area, accordingly light-transmissive area can be increased, therefore, aperture ratio and light-transmittance of a pixel can be improved by using the photo mask, and high PPI property of the exposure machine is fully used, so that the formed pattern has increased fineness, thereby making it possible to manufacture a display product having high PPI.

Second Embodiment

This embodiment provides a photo mask, which differs from the first embodiment in that only a serrated wing part 12 is provided at the two sides of the strip-like main body 11 in the photo mask of the present embodiment.

Figure 7:
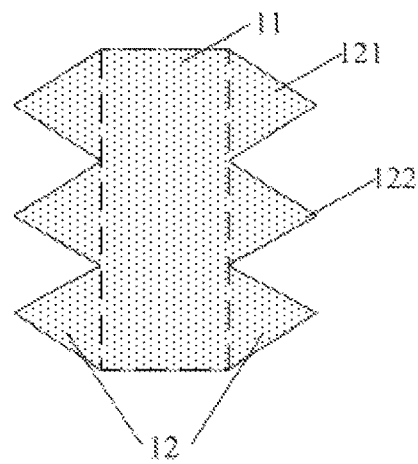
FIG. 7 is a schematic diagram of a patterning structure of a photo mask provided by a second embodiment of the present invention.

As shown in FIG. 7, the patterning structure auxiliary unit includes the serrated wing part 12 connected with the strip-like main body 11.

In this embodiment, the shape and structural parameters of the serrated wing part in the photo mask may refer to those in the first embodiment, and are not repeated herein.

In the photo mask of the present embodiment, by forming the serrated wing part at two sides of the strip-like main body for forming a rectilinear pattern, the resolution of an exposure machine on a micro-pattern is improved, and with the design of the photo mask, the imaging performance is improved without modifying an existing device, and the high PPI property of the exposure machine is fully used, which facilitates improving aperture ratio and light-transmittance of a pixel, so that the formed pattern has increased fineness, thereby making it possible to manufacture a display product having high PPI.

Third Embodiment

This embodiment provides a photo mask, which differs from the first embodiment in that only a columnar part 13 is provided at the two sides of the strip-like main body 11 in the photo mask of the present embodiment.

Figure 8:
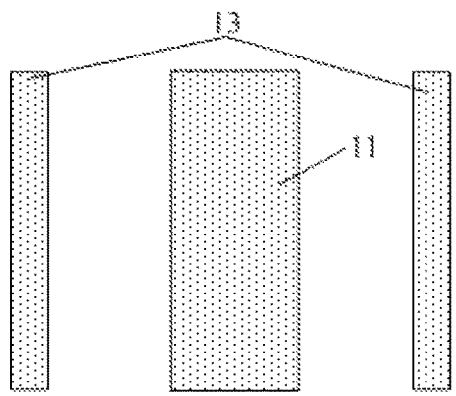
FIG. 8 is a schematic diagram of a patterning structure of a photo mask provided by a third embodiment of the present invention.

As shown in FIG. 8, the columnar part 13 is provided at an outer side of the strip-like main body 11, is spaced apart from the strip-like main body 11, and includes a first column and a second column symmetric with respect to the strip-like main body 11, bottoms and tops of the first and second columns are substantially level with those of the strip-like main body 11, respectively, and a ratio of the width of the strip-like main body 11 to the width of the first column and/or the second column is in the range of 1:1 to 9:1.

In this embodiment, the shape and structural parameters of the columnar part in the photo mask may refer to those in the first embodiment, and are not repeated herein.

In the photo mask of the present embodiment, by forming the columnar part at two sides of the strip-like main body for forming a rectilinear pattern, the resolution of an exposure machine on a micro-pattern is improved, and with the design of the photo mask, the imaging performance is improved without modifying an existing device, and the high PPI property of the exposure machine is fully used, so that the formed pattern has increased fineness, which facilitates improving aperture ratio and light-transmittance of a pixel, thereby making it possible to manufacture a display product having high PPI.

The photo masks provided by the first to third embodiments are applicable to all situations of using an exposure process to form a micro-pattern in a process of fabricating a semiconductor structure by a patterning process, and particularly applicable to situations of using an exposure process to form a micro-pattern in a process of fabricating a liquid crystal display (LCD) device or an organic light-emitting diode (OLED) display device.

Fourth Embodiment

This embodiment provides an exposure system, which includes any one of the photo masks in the first to third embodiments.

With the exposure system, the resulting pattern can have an increased fineness, so that the formed semiconductor device has improved quality.

It could be understood that the above implementations are merely exemplary implementations adopted for describing the principle of the present invention, but the present invention is not limited thereto. For those of ordinary skill in the art, various variations and improvements may be made without departing from the spirit and essence of the present invention, and these variations and improvements shall also be regarded as falling into the protection scope of the present invention.

The invention claimed is:

1. A photo mask, comprising a patterning structure for forming a resulting pattern, the patterning structure comprising a strip-like main body for forming a rectilinear pattern, wherein the patterning structure further comprises a patterning structure auxiliary unit provided at two sides of the strip-like main body, the patterning structure auxiliary unit being capable of adjusting and compensating direction and intensity of light during exposure, and the patterning structure auxiliary unit comprises a columnar part spaced apart from the strip-like main body.

2. The photo mask according to claim 1, wherein the patterning structure auxiliary unit comprises a serrated wing part connected to the strip-like main body.

3. The photo mask according to claim 2, wherein the serrated wing part comprises a first wing and a second wing respectively distributed on the two sides of the strip-like main body and symmetric with respect to the strip-like main body.

4. The photo mask according to claim 3, wherein the first wing is distributed throughout one side of the strip-like main body, and the second wing is distributed throughout the other side of the strip-like main body.

5. The photo mask according to claim 4, wherein each of the first wing and the second wing comprises a plurality of protrusions having a same shape and a same size, a base of each protrusion coincides with a side edge of the strip-like main body, and the highest point of the protrusion is opposite to said side edge of the strip-like main body.

6. The photo mask according to claim 5, wherein the protrusion is in the shape of a triangle, a semicircle, an oval or a fan, and an apex angle of the triangle is in the range of 30 degrees to 120 degrees.

7. The photo mask according to claim 6, wherein the photo mask further comprises a transparent base substrate and a protection layer, the patterning structure is formed between the transparent base substrate and the protection layer.

8. The photo mask according to claim 3, wherein a ratio of a width of the strip-like main body to a width of the first wing or the second wing is in the range of 1:1 to 3:1.

9. The photo mask according to claim 2, wherein the photo mask further comprises a transparent base substrate and a protection layer, the patterning structure is formed between the transparent base substrate and the protection layer.

10. The photo mask according to claim 1, wherein the columnar part comprises a first column and a second column symmetric with respect to the strip-like main body, and bottoms and tops of the first and second columns are substantially level with those of the strip-like main body, respectively.

11. The photo mask according to claim 10, wherein a ratio of a width of the strip-like main body to a width of the first column or the second column is in the range of 1:1 to 9:1.

12. The photo mask according to claim 10, wherein the photo mask further comprises a transparent base substrate and a protection layer, the patterning structure is formed between the transparent base substrate and the protection layer.

13. The photo mask according to claim 1, wherein the patterning structure auxiliary unit further comprises a serrated wing part connected to the strip-like main body, the columnar part is provided at an outer side of and spaced apart from the serrated wing part, and a width of a gap between the serrated wing part and the columnar part at a same side of the strip-like main body is equal to that of the columnar part at said side.

14. The photo mask according to claim 13, wherein the photo mask further comprises a transparent base substrate and a protection layer, the patterning structure is formed between the transparent base substrate and the protection layer.

15. The photo mask according to claim 1, wherein the patterning structure is an opaque pattern.

16. The photo mask according to claim 1, wherein the patterning structure comprises a plurality of strip-like main bodies, and adjacent strip-like main bodies share the columnar part located therebetween.

17. The photo mask according to claim 16, wherein the photo mask further comprises a transparent base substrate and a protection layer, the patterning structure is formed between the transparent base substrate and the protection layer.

18. The photo mask according to claim 1, wherein the photo mask further comprises a transparent base substrate and a protection layer, the patterning structure is formed between the transparent base substrate and the protection layer.

19. An exposure system, comprising the photo mask according to claim 1.

* * * * *